(12) United States Patent
Wong

(10) Patent No.: US 7,470,572 B2
(45) Date of Patent: Dec. 30, 2008

(54) THIN FILM TRANSISTOR LIQUID CRYSTAL DISPLAY AND MANUFACTURING METHOD THEREOF

(75) Inventor: Jia-Fam Wong, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 12/111,376

(22) Filed: Apr. 29, 2008

(65) Prior Publication Data

US 2008/0227231 A1  Sep. 18, 2008

Related U.S. Application Data

(62) Division of application No. 10/663,025, filed on Sep. 15, 2003, now Pat. No. 7,423,289, which is a division of application No. 09/884,286, filed on Jun. 19, 2001, now Pat. No. 6,649,933.

(30) Foreign Application Priority Data

Jun. 29, 2000  (TW) ............................. 89112829 A

(51) Int. Cl.
*H01L 21/00* (2006.01)
(52) U.S. Cl. .................. 438/149; 438/48; 438/128; 438/151; 438/157; 438/283; 257/E29.151; 257/E29.117; 257/E29.137
(58) Field of Classification Search .............. 438/48, 438/128, 149, 151, 157, 283, E29.151, E29.117, 438/E29.137
See application file for complete search history.

(56) References Cited

U.S. PATENT DOCUMENTS

| 6,140,668 A | 10/2000 | Mei et al. | 257/57 |
| 6,218,221 B1 | 4/2001 | Sah | 257/59 |
| 6,297,161 B1 | 10/2001 | Sah | 438/706 |

*Primary Examiner*—Lynne A. Gurley
*Assistant Examiner*—Samuel A Gebremariam
(74) *Attorney, Agent, or Firm*—Ladas & Parry LLP

(57) ABSTRACT

A manufacturing method and the structure of a thin film transistor liquid crystal display (TFT-LCD) are disclosed. The TFT-LCD uses metal electrodes as a mask to thoroughly remove the unwanted semiconductor layer during the etching process for forming the source and drain electrodes. This manufacturing method can reduce the problems caused by the unwanted semiconductor layer, hence improving the quality of the TFT.

6 Claims, 9 Drawing Sheets

THIN FILM TRANSISTOR LIQUID CRYSTAL DISPLAY AND MANUFACTURING METHOD THEREOF

CROSS-REFERENCE TO RELATED APPLICATIONS

This application is a divisional of U.S. application Ser. No. 10/663,025, filed on Sep. 15, 2003, now U.S. Pat. No. 7,423,289, which is a divisional of U.S. application Ser. No. 09/884,286, filed on Jun. 19, 2001, now U.S. Pat. No. 6,649,933, which claims priority to Taiwanese Application No. 89112829, filed on Jun. 29, 2000.

BACKGROUND OF THE INVENTION

1. Field of the Invention

The present invention relates to a thin film transistor and the manufacturing method thereof, and more particularly to a thin film transistor used in a thin film transistor liquid crystal display.

2. Description of the Related Art

In an active matrix liquid crystal displays, a thin film transistor (TFT) is commonly adopted for good driving and switching capabilities. FIG. 1 shows the essential components of a TFT used in a thin film transistor liquid crystal display (TFT-LCD). The substrate 1 is made from glass or quartz. A metal layer 2a is used as the gate electrode of the TFT. The electrode 2b is an electrode of a storage capacitor. A insulating layer 3 is formed on the substrate 1. A semiconductor layer 4 is further formed above the insulating layer 3 and usually made from amorphous silicon. An n type doped polysilicon layer 5 and a metal electrode 6 are used to form source/drain electrodes of the TFT. A passivation layer 7 is formed above the substrate 1. A transparent conductive layer 8, such as an ITO layer, is used to form the pixel electrode. Between the source electrode and the drain electrode, a channel 9 is defined.

According to the TFT shown in FIG. 1, the amorphous silicon layer 4 is formed on the insulating layer 3, and the channel 9 is defined by etching the amorphous silicon layer 4. During the above etching process, if any amorphous silicon is left above the insulating layer 3 at the position outside the TFT, it will harm the properties of the TFT and reduce the quality of the TFT-LCD. Additionally, two dielectric layers, including the insulating layer 3 and the passivation layer 7, are formed on the substrate 1 and will reduce the transmittance of the substrate 1.

SUMMARY OF THE INVENTION

An object of the present invention is to provide a method for forming a thin film transistor liquid crystal display (TFT-LCD) using metallic electrodes as a mask to remove the unwanted amorphous silicon layer when forming the source/drain electrodes. This method avoids the problems resulting from unwanted amorphous silicon layer, and enhances the TFT quality.

Another object of the present invention is to provide a manufacturing method for forming a thin film transistor liquid crystal display (TFT-LCD) to efficiently reduce the thickness of the insulating layer by controlling the etching condition for forming the drain/source electrodes without affecting the quality of the TFT. It also increases the capacitance Cs of the storage capacitor by reducing the thickness of the insulating layer.

Yet another object of the present invention is to provide a method for forming a thin film transistor liquid crystal display (TFT-LCD) to define a shielding metal layer above a lower electrode of a storage capacitor. After the drain/source electrodes are patterned, a number of layers are formed between the lower electrode and the shielding metal layer for increasing the storage capacitor.

To achieve the objects described, the present invention provides a first method for forming a thin film transistor liquid crystal display (TFT-LCD). The TFT-LCD has at least one thin film transistor (TFT) and one storage capacitor. The manufacturing process is described below. First, a substrate is provided, a first and a second conductive layer are then deposited on the substrate to respectively form a gate electrode of the TFT and a bottom electrode of the storage capacitor. Then, forming an insulating layer above these conductive layers and the substrate. Further, sequentially forming a semiconductor layer and a doped silicon layer on the insulating layer, then depositing a sacrifice layer with an island shape on the doped silicon layer, especially directly above the first conductive layer. A metal layer is formed covering the island-shaped sacrifice layer and the doped silicon layer, the metal layer is then patterned to form source and drain electrodes above the first conductive layer. A channel is defined between the source electrode and the drain electrode, and the sacrifice layer is exposed in the channel. A portion of the substrate not covered by the source electrode, the drain electrode, and the channel is defined as a non-TFT region so as to expose the doped silicon in the non-TFT region. By using the source and the drain electrodes as a mask, several etching processes are performed at the same time during: (a) the island-shaped sacrifice layer and the doped silicon layer in the channel are removed so that the semiconductor layer is exposed in the channel; and (b) the doped silicon layer and the semiconductor layer on the non-TFT region are removed so that the insulating layer is exposed in the non-TFT region. Finally, a passivation layer is formed to cover the source electrode, the drain electrode, the channel, and the substrate.

To achieve the objects described, the present invention provides a second method for forming a thin film transistor liquid crystal display (TFT-LCD). The TFT-LCD has at least one thin film transistor (TFT) and one storage capacitor. The manufacturing process is described below. First, a substrate is provided, a first and a second conductive layer are then deposited on the substrate to form a gate electrode of the TFT and a bottom electrode of the storage capacitor. Then, forming an insulating layer above these conductive layers and the substrate. Further, sequentially forming a semiconductor layer and a doped silicon layer on the insulating layer, then depositing a sacrifice layer with an island shape on the doped silicon layer, especially directly above the first conductive layer. A metal layer is formed covering the island-shaped sacrifice layer and the doped silicon layer, the metal layer is then patterned to form a source electrode and a drain electrode above the first conductive layer, and form a shielding metal layer above the second conductive layer. A channel is defined between the source electrode and the drain electrode, and the sacrifice layer is exposed in the channel. A capacitor region is defined as a portion of the substrate covered by the shielding metal layer. A portion of the substrate not covered by the source electrode, the drain electrode, the capacitor, and the channel is defined as a non-TFT region so as to expose the doped silicon in the non-TFT region. By using the source electrode, the drain electrode, and the shielding metal layer as a mask, several etching processes are performed at the same time during: (a) the island-shaped sacrifice layer and the doped silicon layer in the channel are removed so that the semiconductor layer is exposed in the channel; and (b) the doped silicon layer and the semiconductor layer on the non-TFT region are removed so that the insulating layer is exposed. Finally, a passivation layer is formed to cover the source electrode, the drain electrode, the channel, and the capacitor region.

To achieve the objects described, the present invention provides a third method for forming a thin film transistor liquid crystal display (TFT-LCD). The third manufacturing method is similar to the first manufacturing method. The major difference between the third method and the first method is the position of the sacrifice layer. In the third method, the island-shaped sacrifice layer is formed on the semiconductor layer, and the doped silicon layer is formed above the sacrifice layer in the channel.

To achieve the objects described, the present invention provides a fourth method for forming a thin film transistor liquid crystal display (TFT-LCD). The fourth manufacturing method is similar to the second manufacturing method. The major difference between the fourth method and the second method is the position of the sacrifice layer. In the fourth method, the island-shaped sacrifice layer is formed on the semiconductor layer, and the doped silicon layer is formed above the sacrifice layer in the channel.

In these methods mentioned above, the etching rates of the island-shaped sacrifice layer, the doped silicon layer, and the semiconductor layer are $R_{IS}$, $R_n$, and $R_a$ respectively. The thickness of the island-shaped sacrifice layer, the doped silicon layer, and the semiconductor layer are $T_{IS}$, $T_n$, and $T_a$ respectively. The time for removing the island-shaped sacrifice layer in the channel and the doped silicon layer ($T_{IS}/R_{IS}+T_n/R_n$) is not less than the time for removing the doped silicon layer and the semiconductor layer on the non-TFT region ($T_n/R_n+T_a/R_a$).

By controlling the thickness of the sacrifice layer, the thickness of the insulating layer on the non-TFT region is reduced at the same time during the etching processes for etching the doped silicon layer and the sacrifice layer in the channel as well as etching away the doped silicon layer, the semiconductor layer, and a portion of the insulating layer in the non-TFT region.

The portion of the removed insulating layer has an etching rate $R_{INS}$ and a thickness $T_{INS}$, and the time for removing the sacrifice layer and the doped silicon layer in the channel ($T_{IS}/R_{IS}+T_n/R_n$) is equal to the time for removing the doped silicon layer, the semiconductor layer and the removed insulating layer in the non-TFT region ($T_n/R_n+T_a/R_a+T_{INS}/R_{INS}$).

One type of thin film transistor (TFT) is produced in the present invention. The TFT includes a gate electrode with an island shape formed on a substrate, an insulating layer covering the island-shaped gate electrode, an semiconductor layer with an island shape formed on the insulating layer, and a source doped silicon layer and a drain doped silicon layer formed on the semiconductor layer. The island-shaped semiconductor layer is positioned above the island-shaped gate electrode. A channel is defined between the source doped silicon layer and the drain doped silicon layer, and the island-shaped semiconductor layer is exposed in the channel. The TFT further includes first and second sacrifice layers having island shapes and respectively formed on the source doped silicon layer and drain doped silicon layer. The first and the second island-shaped sacrifice layers are separated by the channel. The TFT further includes a source electrode formed on the first sacrifice layer and the source dope silicon layer, and a drain electrode formed on the second sacrifice layer and the drain doped silicon layer. The thickness of the first and second sacrifice layers are varied according to the thickness of the island-shaped semiconductor layer because the time for etching the first and second sacrifice layers is substantially equal to the time for etching the semiconductor layer in the subsequent process.

A second type of thin film transistor is produced in the present invention. The TFT includes a gate electrode with an island shape formed on a substrate, an insulating layer covering the island-shaped gate electrode, and semiconductor layer with an island shape formed on the insulating layer, and first and second sacrifice layers with island shapes formed on the semiconductor layer. The first and second island-shaped sacrifice layers are positioned above the gate electrode. A channel is defined between the first and the second sacrifice layers, and the semiconductor layer is exposed in the channel. The TFT further includes a source doped silicon layer and a drain doped silicon layer formed above the first sacrifice layer, the second sacrifice layer, and the semiconductor layer. The source and drain doped silicon layers are spaced apart by the channel. The TFT further includes a source electrode and a drain electrode respectively formed on the source doped silicon layer and the drain doped silicon layer. The thickness of the first and second island-shaped sacrifice layers are varied according to the thickness of the island-shaped semiconductor layer because the time for etching the first and second island-shaped sacrifice layers is substantially equal to the time for etching the semiconductor layer in the subsequent process.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE PREFERRED EMBODIMENT

The First Embodiment

Figure 1:
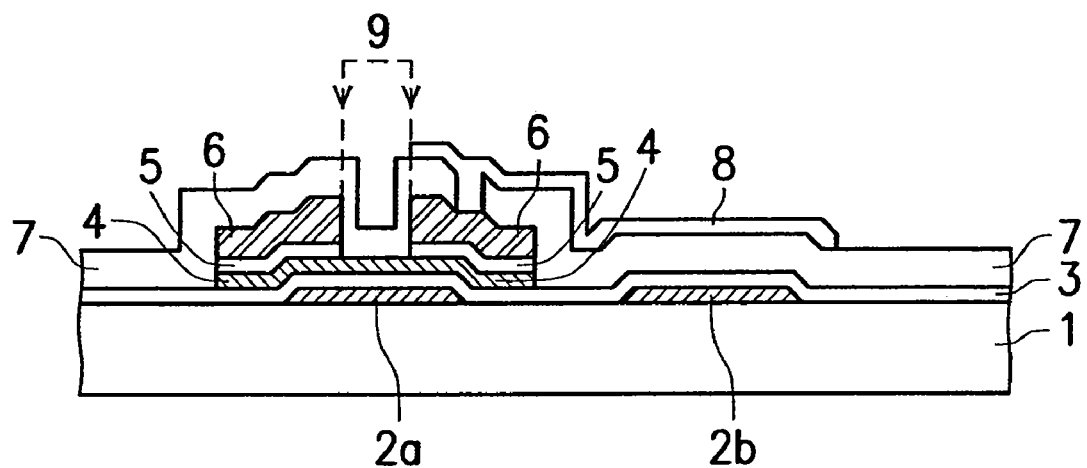
FIG. 1 is a perspective diagram of the essential component of a TFT-LCD in the prior art.

FIG. 2A to FIG. 2F are the sectional diagrams of the manufacturing process described in the first embodiment of the present invention.

First of all, a first conductive layer 22a and a second conductive layer 22b are deposited on a substrate 21 to form a gate electrode 22a of a thin film transistor (TFT) and a bottom electrode 22b of a storage capacitor. Usually, the first and the second conductive layers 22a and 22b are metal layers, and the substrate 21 is made of glass or quartz.

Figure 2A:
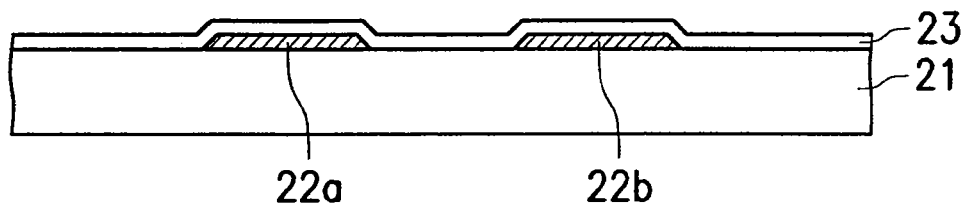
FIG. 2A to FIG. 2F are the sectional diagrams of the manufacturing process described in the first embodiment of the present invention.

Next, forming an insulating layer 23 above the first and the second conductive layers 22a, 22b and the substrate 21, as shown in FIG. 2A. Then, a semiconductor layer 24 and a doped silicon layer 25 are formed on the insulating layer 23.

In the present embodiment, the semiconductor layer 24 is an amorphous silicon layer, and the doped silicon layer 25 is an n type doped poly-silicon layer.

Figure 2B:
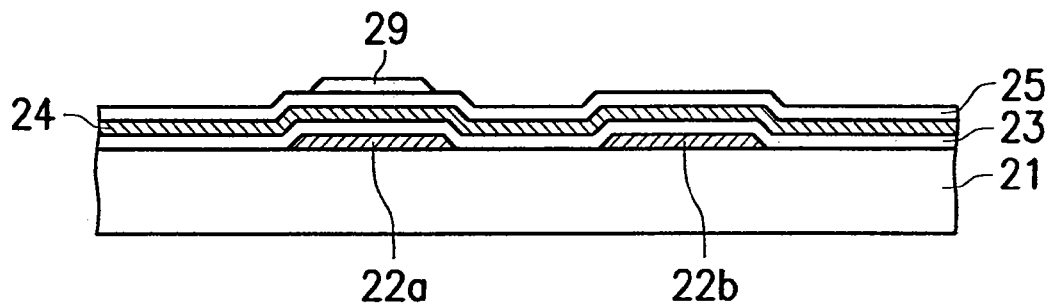
Figure 2C:
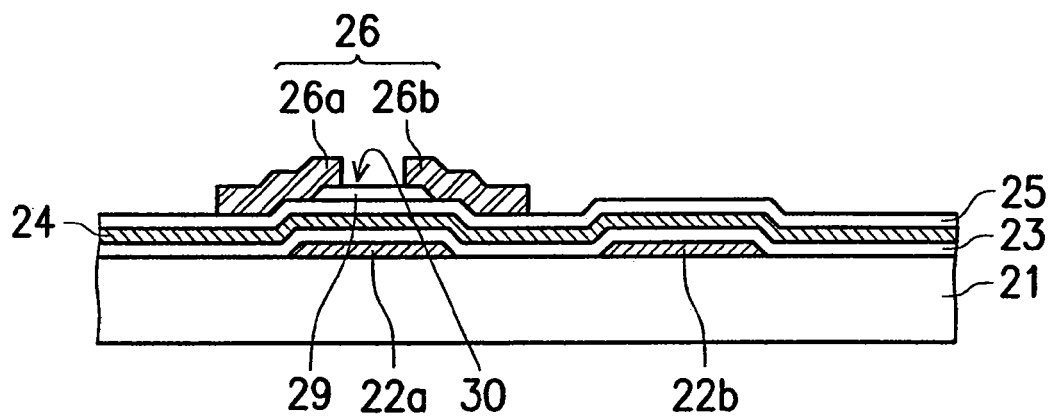

A sacrifice layer 29 with an island shape is formed on the doped silicon layer 25, and especially above the first conductive layer 22a as shown in FIG. 2B. A metal layer 26 is formed to cover the island-shaped sacrifice layer 29 and the doped silicon layer 25. As shown in FIG. 2c, the metal layer 26 is patterned to form a source electrode 26a and a drain electrode 26b above the gate electrode 22a. A channel 30 is defined between the source electrode 26a and the drain electrode 26b so as to expose the sacrifice layer 29 in the channel 30. A portion of the substrate 21 which is not covered by the source electrode 26a, the drain electrode 26b, and the channel 30 is defined as a non-TFT region, and the doped silicon layer is exposed in the non-TFT region as shown in FIG. 2C.

By using the source and the drain electrodes 26a and 26b as a mask to perform the following etching processes at the same time: (1) removing the island-shaped sacrifice layer 29 and the doped silicon layer 25 in the channel, and (2) removing the doped silicon layer 25 and the semiconductor layer 24 in the non-TFT region, so that the semiconductor layer 24 is exposed in the channel 30 and the insulating layer 23 is exposed in the non-TFT region as shown in FIG. 2D.

In the etching process, etching rates of the island-shaped sacrifice layer 29, the doped silicon layer 25, and the semiconductor layer 24 are respectively $R_{IS}$, $R_n$, and $R_a$. The thickness of the island-shaped sacrifice layer 29, the doped silicon layer 25, and the semiconductor layer 24 are $T_{IS}$, $T_n$, and $T_a$, respectively. The amount of $T_{IS}$, $T_n$, and $T_a$ can be adjusted in advance to cooperate with a suitable etching process so that the time $T_1$ for removing the sacrifice layer 29 and the doped silicon layer 25 in the channel is equal to the time $T_2$ for removing the doped silicon layer 25 and the semiconductor layer 24 in the non-TFT region. $T_1$ equals to $T_{IS}/R_{IS}+T_n/R_n$, and $T_2$ equals to $T_n/R_n+T_a/R_a$, that is $(T_{IS}/R_{IS}+T_n/R_n) \geq (T_n/R_n+T_a/R_a)$. After the etching process, the semiconductor layer 24 is exposed in the channel 30, and the insulating layer 23 is exposed in the non-TFT region.

Figure 2D:
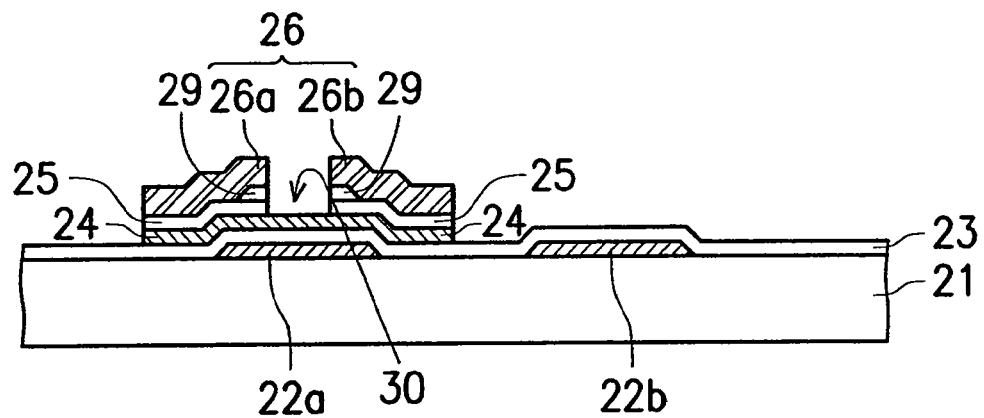

The thickness of the island-shaped sacrifice layer 29 can be adjusted so that a portion of the insulating layer 23 can be removed after etching away the doped silicon layer 25 and the semiconductor layer 24 in the non-TFT region during the etching process for removing the island-shaped sacrifice layer 29 and the doped silicon layer 25 in the channel, as shown in FIG. 2D. In other words, when the etching rate and the thickness of the removed portion of the insulating layer 23 are respectively $R_{INS}$ and $T_{INS}$, the time $T_1$ for removing the sacrifice layer 29 and the doped silicon layer 25 in the channel $(T_1=T_{IS}/R_{IS}+T_n/R_n)$ is equal to the time $T_3$ for removing the doped silicon layer 25, the semiconductor layer 24, and the removed insulating layer 23 in the non-TFT region $(T_3=T_n/R_n+T_a/R_a+T_{INS}/R_{INS})$.

Further, a passivation layer 27 is formed to cover the source electrode 26a, the drain electrode 26b, and the channel 30. Therefore, this kind of TFT can be suitable for applying in an in-plane-switch (IPS) type TFT-LCD.

Figure 2E:
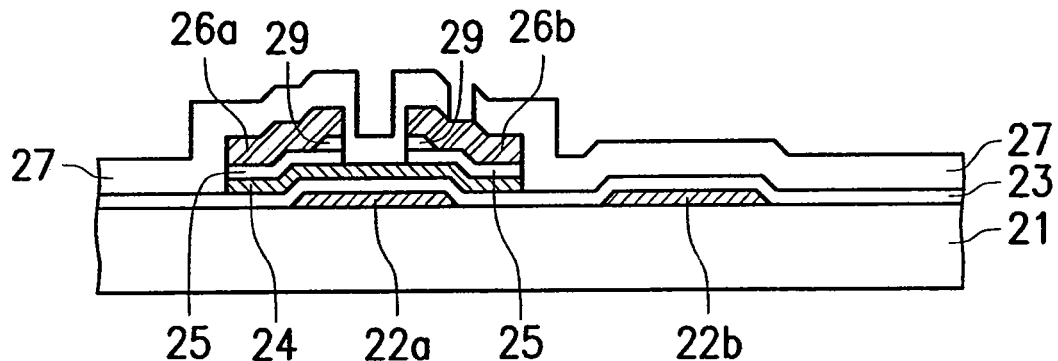
Figure 2F:
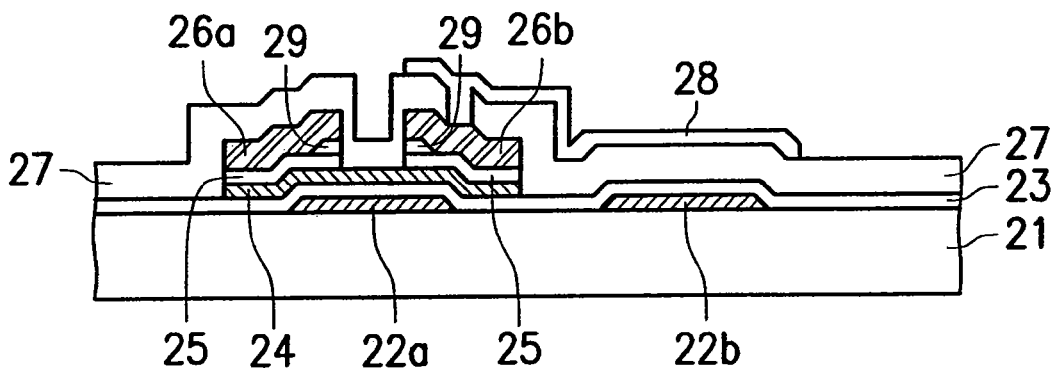

In the non-IPS type TFT-LCD, the passivation layer 27 is patterned to expose the drain electrode 26b as shown in FIG. 2E. Finally, a transparent conductive layer 28 is formed on the passivation layer 27 to electrically connect to the drain electrode 26b as shown in FIG. 2F. The transparent conductive layer can be an indium tin oxide (ITO) layer.

The Second Embodiment

FIG. 3A to FIG. 3F are the sectional diagrams of the manufacturing process described in the second embodiment of the present invention. The same structures are label by the same symbolic numberings as FIG. 2A to FIG. 2F.

Figure 3A:
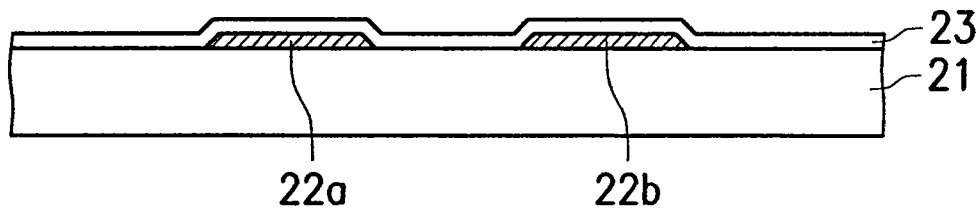
FIG. 3A to FIG. 3F are the sectional diagrams of the manufacturing process described in the second embodiment of the present invention.
Figure 3B:
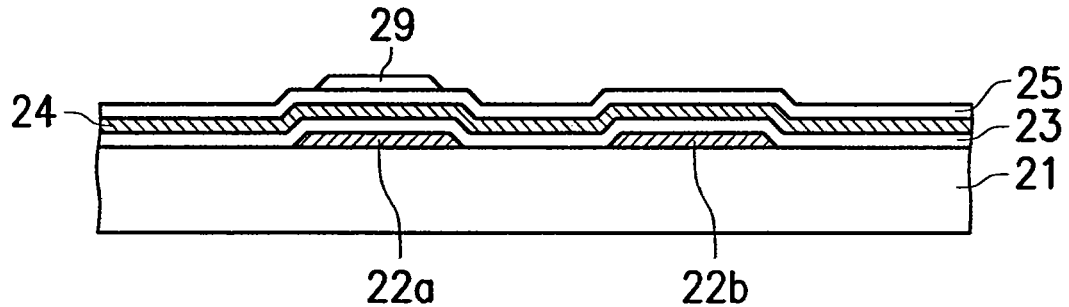
Figure 3C:
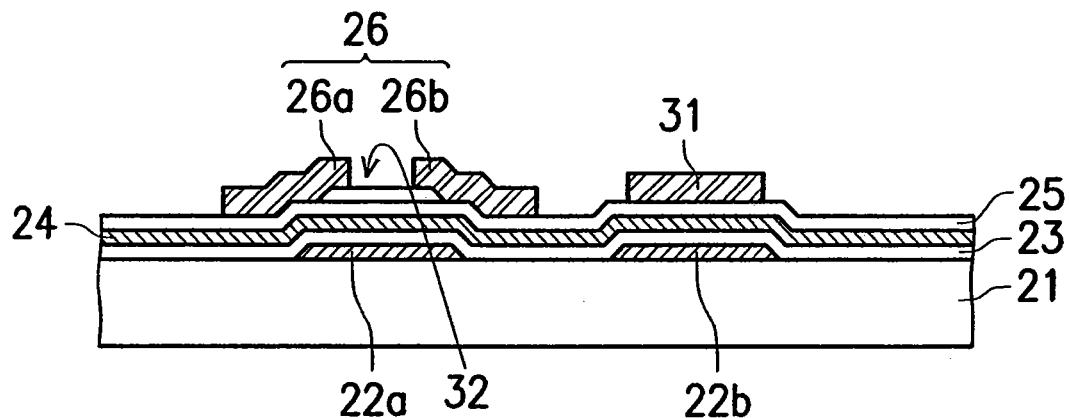
Figure 3D:
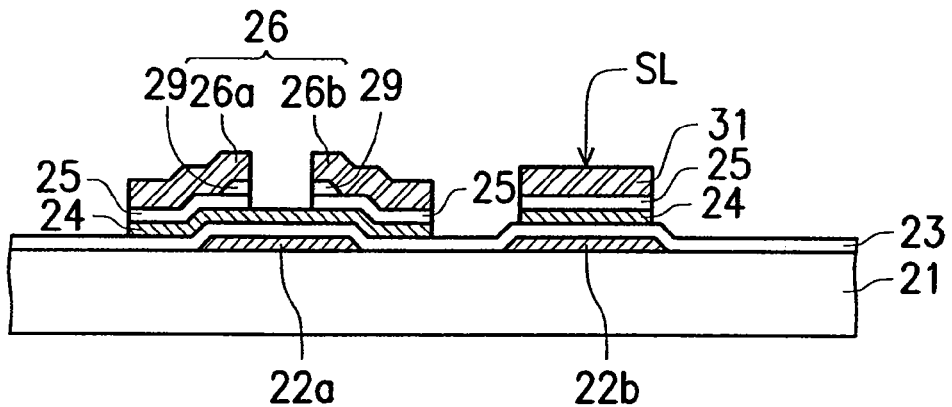

The process of the second embodiment is similar to that of the first embodiment. The major difference is that a shielding metal layer 31 is formed directly above the lower electrode 22b of the storage capacitor during the process for defining the source and drain electrodes 26a and 26b, as shown in FIG. 3C. Thereby, the shielding metal layer 31, the doped silicon layer 25, and the semiconductor layer 24 form a stack layer SL above the insulating layer 23 and the lower electrode 22b, as shown in FIG. 3D.

A channel 32 is defined between the source and the drain electrodes 26a and 26b. A portion of the substrate uncovered by the source electrode 26a, the drain electrode 26b, the channel 32, and the storage capacitor is defined as a non-TFT region. Meanwhile, the time $T_1$ for removing the sacrifice layer 29 and the doped silicon layer 25 in the channel $(T_1=T_{IS}/R_{IS}+T_n/R_n)$ is not less than the time $T_2$ for removing the doped silicon layer 25 and the semiconductor layer 24 $(T_2=T_n/R_n+T_a/R_a)$. When the etching process is terminated, the semiconductor layer 24 is exposed in the channel 32, and the insulating layer 23 is exposed on the non-TFT region as shown in FIG. 3D.

Figure 3E:
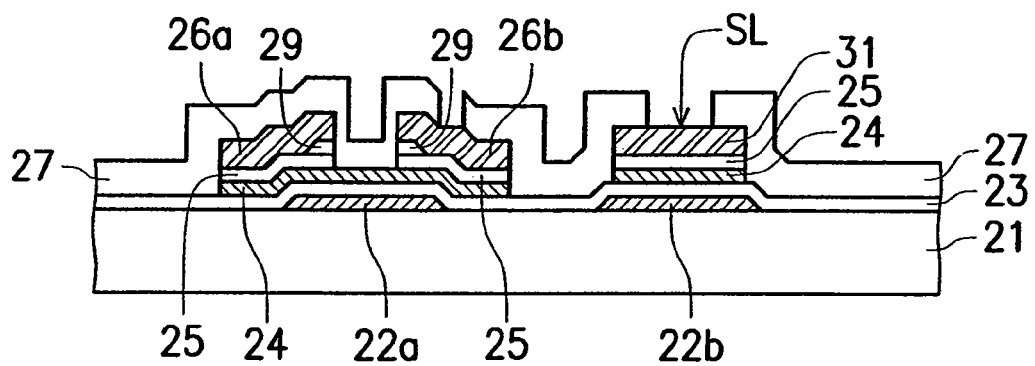

According to FIG. 3E, a passivation layer 27 is formed to cover the TFT, and the passivation layer 27 is then patterned to expose the drain electrode 26b and the stack layer SL. Finally, defining a transparent conductive layer 28 on the passivation layer 27. The transparent conductive layer 28 is made of ITO, and electrically connected to the drain electrode 26b. The transparent conductive layer 28 also connects to the shielding metal layer 31 to form an upper electrode of the storage capacitor.

The Third Embodiment

FIG. 4A to FIG. 4F are the sectional diagrams of the manufacturing process in the third embodiment of the present invention.

First of all, a first conductive layer 42a and a second conductive layer 42b are deposited on a substrate 41 to form a gate electrode 42a of a thin film transistor (TFT) and a bottom electrode 42b of a storage capacitor.

Figure 4A:
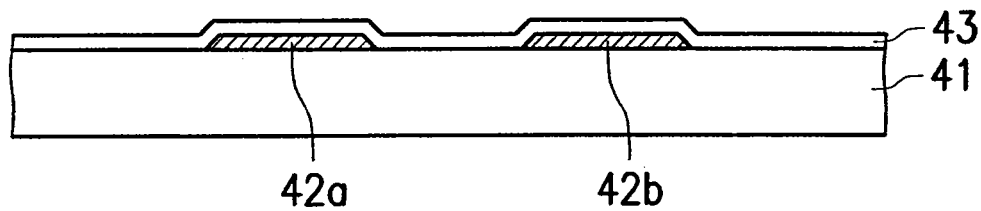
FIG. 4A to FIG. 4F are the sectional diagrams of the manufacturing process described in the third embodiment of the present invention.
Figure 4B:
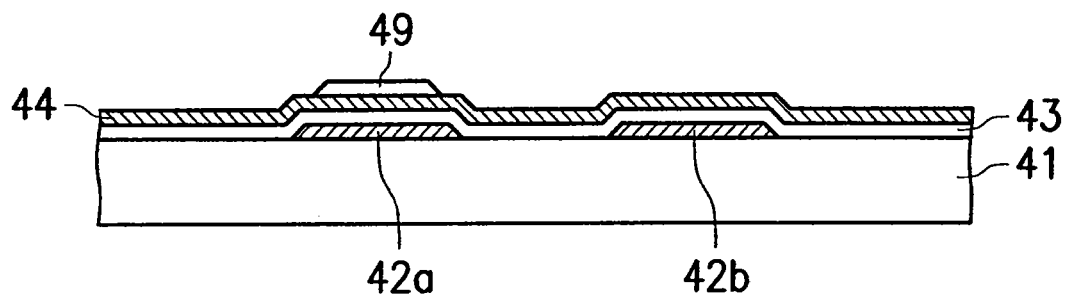

Next, forming an insulating layer 43 above the first and the second conductive layers 42a, 42b and the substrate 41, as shown in FIG. 4A. Then, a semiconductor layer 44 is formed on the insulating layer 43. In the present embodiment, the semiconductor layer 44 is an amorphous silicon layer.

A sacrifice layer 49 with an island shape is then formed on the semiconductor layer 44, and directly above the first conductive layer 42a. Next, a doped silicon layer 45 is formed on the island-shaped sacrifice layer 49 and the semiconductor layer 44. The doped silicon layer 45 can be an n type doped poly-silicon layer.

Figure 4C:
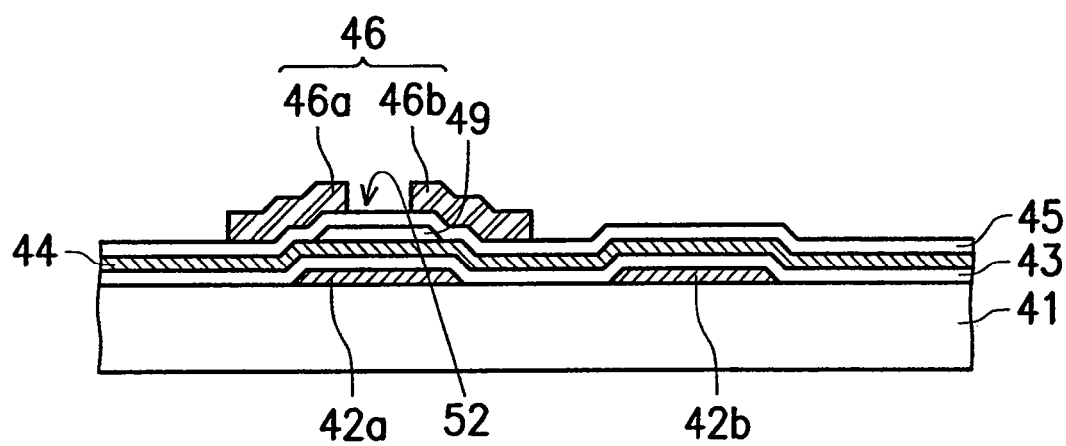

A metal layer 46 is formed to cover the doped silicon layer 45. As shown in FIG. 4c, the metal layer 46 is patterned to form a source electrode 46a and a drain electrode 46b above the gate electrode 42a. A channel 52 is defined between the source electrode 46a and the drain electrode 46b so as to expose the doped silicon layer 45 in the channel 52. A portion of the substrate 41 which is not covered by the source electrode 46a, the drain electrode 46b, and the channel 52 is defined as a non-TFT region, and the doped silicon layer 45 is also exposed in the non-TFT region as shown in FIG. 4C.

Figure 4D:
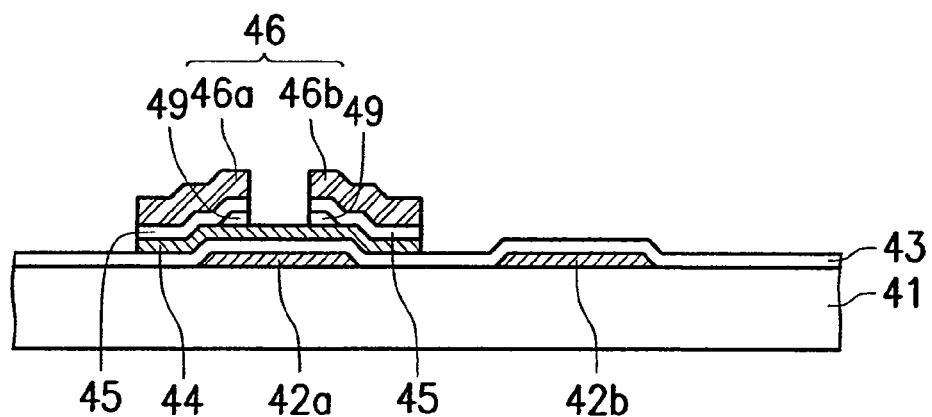

By using the source and the drain electrodes 46a and 46b as a mask to perform the following etching processes at the same time: (1) removing the doped silicon layer 45 and the island-shaped sacrifice layer 49 in the channel 52, and (2) removing the doped silicon layer 45 and the semiconductor layer 44 in the non-TFT region, so that the semiconductor layer 44 is exposed in the channel 52 and the insulating layer 43 is exposed in the non-TFT region as shown in FIG. 4D.

In the etching process, etching rates of the island-shaped sacrifice layer 49, the doped silicon layer 45, and the semiconductor layer 44 are respectively $R_{IS}$, $R_n$, and $R_a$. The thickness of the island-shaped sacrifice layer 49, the doped silicon layer 45, and the semiconductor layer 44 are $T_{IS}$, $T_n$, and $T_a$ respectively. The amount of $T_{IS}$, $T_n$, and $T_a$ can be adjusted in advance to cooperate with a suitable etching process so that the time $T_1$ for removing the sacrifice layer 49 and the doped silicon layer 45 in the channel is not less than the time $T_2$ for removing the doped silicon layer 45 and the semiconductor layer 44 in the non-TFT region. $T_1$ equals to $T_{IS}/R_{IS}+T_n/R_n$ and $T_2$ equals to $T_n/R_n+T_a/R_a$, that is $(T_{IS}/R_{IS}+T_n/R_n) \geq (T_n/R_n+T_a/R_a)$. After the etching process, the semiconductor layer 44 is exposed in the channel 52, and the insulating layer 43 is exposed in the non-TFT region.

Further, the thickness of the island-shaped sacrifice layer 49 is controlled so that a portion of the insulating layer 43 can be removed when etching the sacrifice layer 49 and the doped silicon layer 45 in the channel 52. Therefore, the thickness of the insulating layer 43 can be reduced.

More clearly, the etching rate and the thickness of the removed portion of the insulating layer 43 are $R_{INS}$ and $T_{INS}$. The time $T_1$ for removing the island-shaped sacrifice layer 49 and the doped silicon layer 45 in the channel 52 ($T_1=T_{IS}/R_{IS}+T_n/R_n$) will be equal to the time $T_3$ for removing the doped silicon layer 45, the semiconductor layer 44, and the removed part of the insulating layer 43 on the non-TFT region ($T_3=T_n/R_n+T_a/R_a+T_{INS}/R_{INS}$). The thickness of the insulating layer 43 is reduced so that the transmittance of the substrate 41 can be increased, and the capacitance of the storage capacitor can also be increased.

Figure 4E:
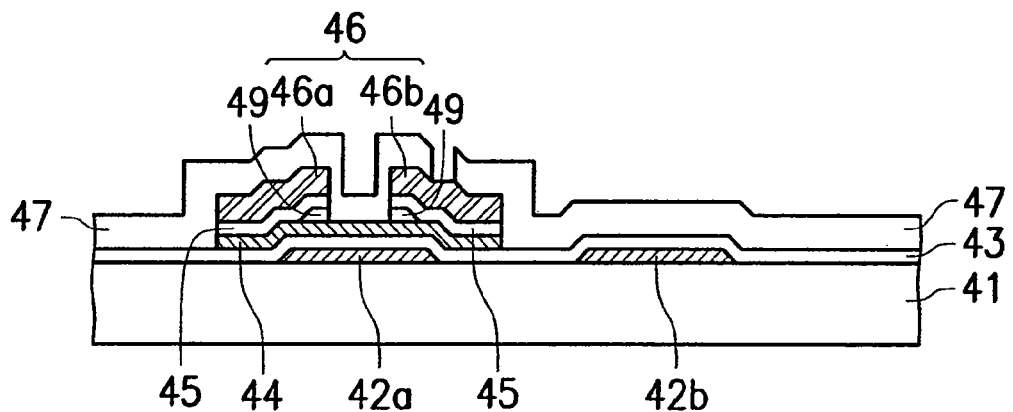
Figure 4F:
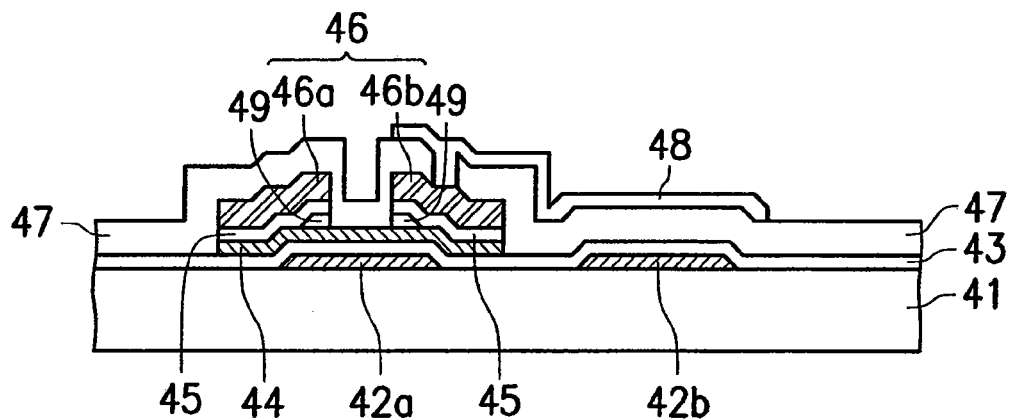

Then, a passivation layer 47 is formed and patterned to expose the drain electrode 46b, as shown in FIG. 4E. Finally, a transparent conductive layer 48, such as an ITO layer, is formed on the passivation layer 47, and electrical connected to the drain electrode 46b, as shown in FIG. 4F.

The Fourth Embodiment

FIG. 5A to FIG. 5F are the sectional diagrams of the manufacturing process described in the fourth embodiment of the present invention. The same structures are labeled by the same symbolic numberings as FIG. 4A to FIG. 4F.

Figure 5A:
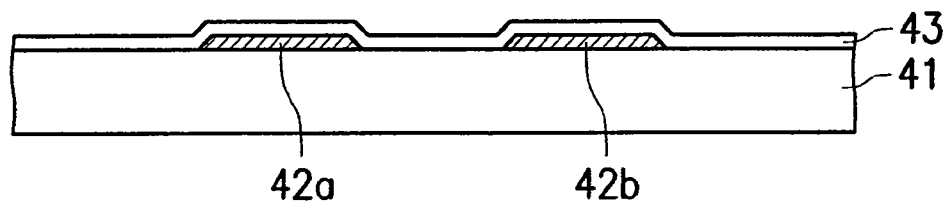
FIG. 5A to FIG. 5F are the sectional diagrams of the manufacturing process described in the forth embodiment of the present invention.
Figure 5B:
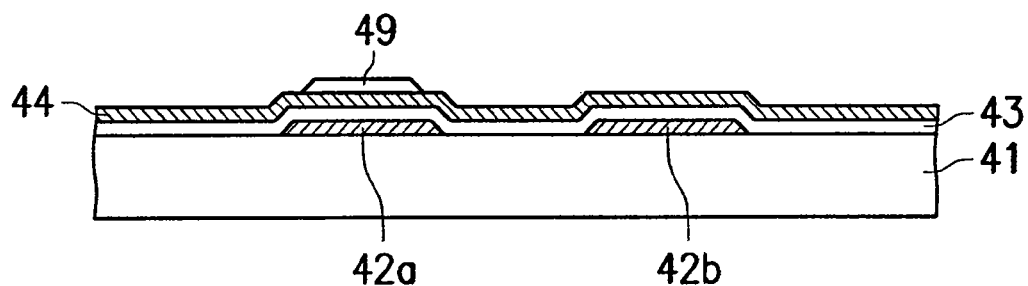
Figure 5C:
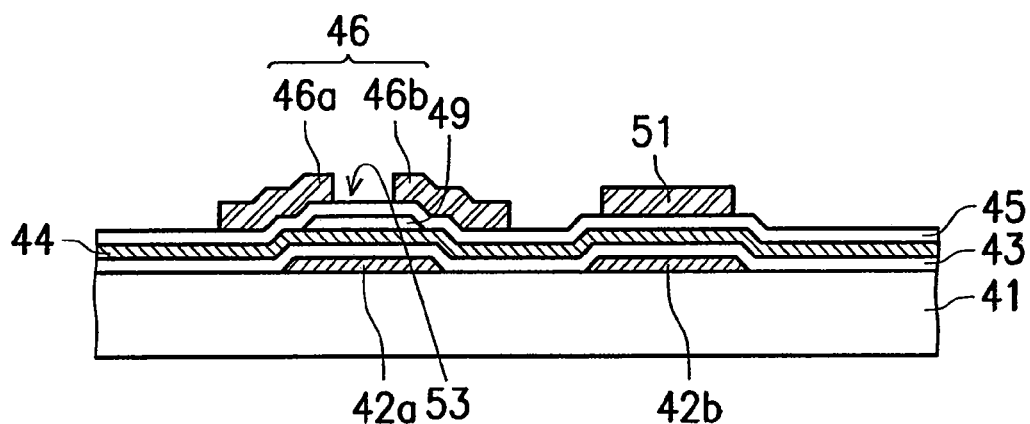
Figure 5D:
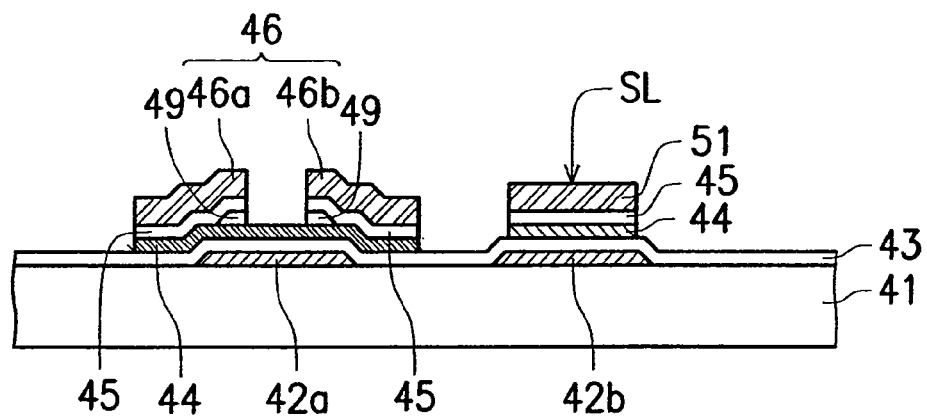
Figure 5E:
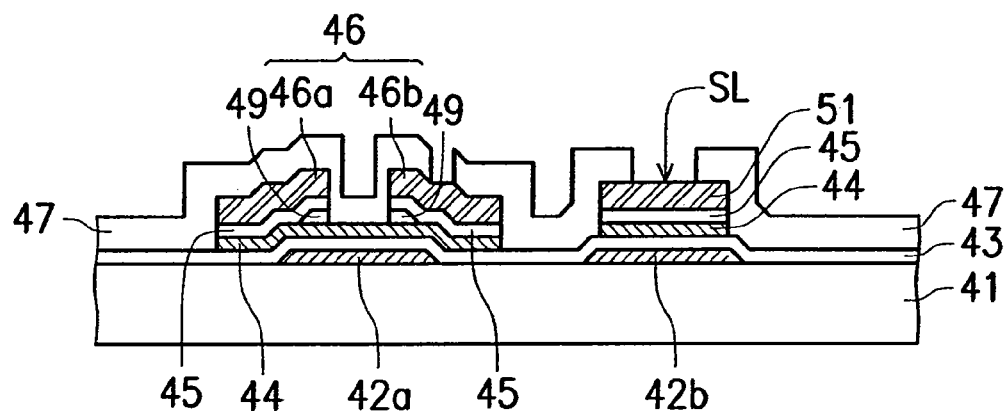

The process of the fourth embodiment is similar to that of the third embodiment. The major difference is that a shielding metal layer 51 is formed directly above the lower electrode 42b of the storage capacitor during the process for defining the source and drain electrodes 46a and 46b, as shown in FIG. 5C. Therefore, the metal shielding layer 51, the doped silicon layer 45, and the semiconductor layer 44 form a stack layer SL above the insulating layer 43 and the lower electrode 42b, as shown in FIG. 5D.

A channel 53 is defined between the source and the drain electrodes 46a and 46b. A portion of the substrate uncovered by the source electrode 46a, the drain electrode 46b, the channel 53, and the storage capacitor is defined as a non-TFT region. Meanwhile, the time for removing the sacrifice layer 49 and the doped silicon layer 45 in the channel $T_1$ (=$T_{IS}/R_{IS}+T_n/R_n$) is not less than the time spent for removing the doped silicon layer 45 and the semiconductor layer 44 $T_2$ (=$T_n/R_n+T_a/R_a$). When the etching process is terminated, the semiconductor layer 44 is exposed in the channel 53, and the insulating layer 43 is exposed on the non-TFT region as shown in FIG. 5D.

Finally, defining a transparent conductive layer 48 on the passivation layer 27. The transparent conductive layer 48 is made of ITO, and electrically connected to the drain electrode 46b. The transparent conductive layer 48 also connects to the shielding metal layer 51 to form an upper electrode of the storage capacitor.

Besides, when forming the channel 53, a portion of the insulating layer 43 can be removed. The etching rate and the thickness of the removed portion of the insulating layer 43 are $R_{INS}$ and $T_{INS}$. The time $T_1$ for removing the island-shaped sacrifice layer 49 and the doped silicon layer 45 in the channel 53 ($T_1=T_{IS}/R_{IS}+T_n/R_n$) will be equal to the time $T_3$ for removing the doped silicon layer 45, the semiconductor layer 44, and the removed part of the insulating layer 43 on the non-TFT region ($T_3=T_n/R_n+T_a/R_a+T_{INS}/R_{INS}$). The thickness of the insulating layer 43 is reduced so that the transmittance of the substrate 41 can be increased.

Although a part of the insulating layer is removed, there is still a stack layer SL formed between the lower electrode 42b and the upper electrode of the storage capacitance. The stack layer SL can increase the capacitance when the insulating layer 43 is thinner.

From the embodiments described, the present invention uses metal electrodes as a mask to thoroughly remove the semiconductor layer outside the thin film transistor on the substrate. This reduces the product defects caused by the residual semiconductor layer, thus enhancing the product quality. Moreover, forming stacked layers between the lower and upper electrodes of the capacitor can increase the capacitance of the capacitor. The thickness of the insulating layer can be reduced for increasing the light transmittance of the TFT-LCD.

Figure 3F:
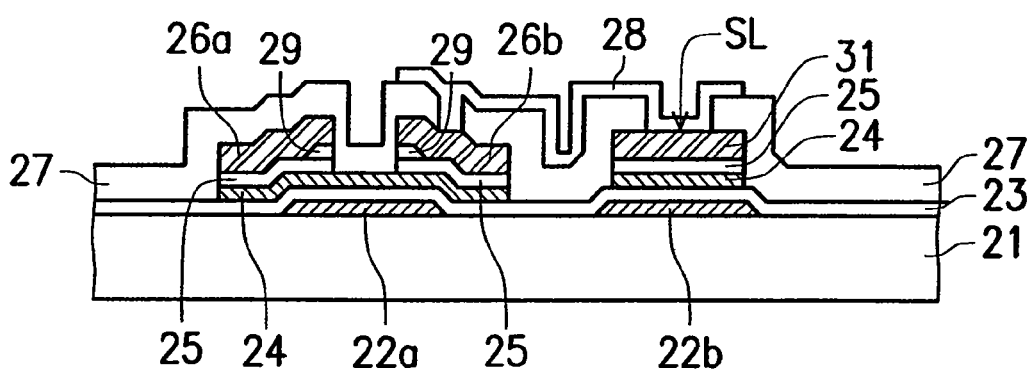

Referring to the FIGS. 2F and 3F, One kind of thin film transistor (TFT) is described as follows. The thin film transistor (TFT) includes a gate electrode 22a with an island shape formed on a substrate 21, an insulating layer 23 covering the gate electrode 22a, and a semiconductor layer 24 with an island shape formed on the insulating layer 23, and positioned directly above the gate electrode 22a. The TFT further includes source and drain doped silicon layers 25 formed on the semiconductor layer 24. A channel 30 or 32 is defined between the source doped silicon layer and the drain doped silicon layer 25 to expose the semiconductor layer 24 in the channel. The TFT further includes the first and second sacrifice layers 29, a source electrode 26a, and a drain electrode 26b. The first and second sacrifice layers 29 have island shapes and are respectively formed on the source and drain doped silicon layers 25. The first and second sacrifice layers 29 are spaced apart by the channel 30, 32. The source electrode 26a is formed above the first sacrifice layer 29 and the source dope silicon layer 25. The drain electrode 26b is formed above the second sacrifice layer 29 and the drain doped silicon layer 25. The thickness of the first and second sacrifice layers 29 varies according to the thickness of the semiconductor layer 24 because the time for etching the first and second sacrifice layers 29 is substantially equal to the time for etching the semiconductor layer 24 in the subsequent process.

Figure 5F:
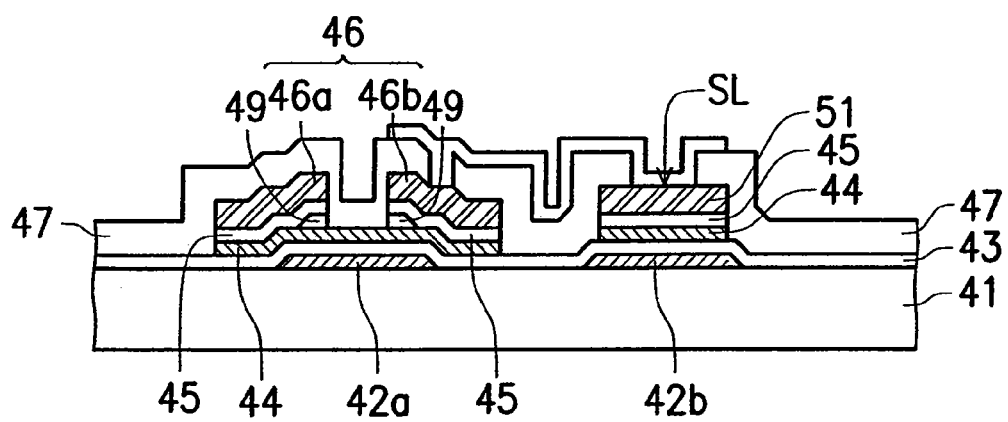

Referring to the FIGS. 4F and 5F, a second kind of thin film transistor (TFT) is described as follows. The thin film transistor (TFT) includes a gate electrode 42a with an island shape formed on a substrate 41, an insulating layer 43 covering the gate electrode 42a, a semiconductor layer 44 with an island shape formed on the insulating layer 43 and positioned above the gate electrode 42a, and first and second sacrifice layers 49 with island shapes formed on the semiconductor layer. A channel 52, 53 is defined between the first and second sacrifice layers 49 so as to expose the semiconductor layer 44 in the channel 52, 53. The TFT further includes source and drain doped silicon layers 45 formed above the first sacrifice layer 49, second sacrifice layer 49, and the semiconductor layer 44. The source and the drain doped silicon layers 45 are spaced apart by the channel 52, 53. The TFT further includes a source electrode 46a and a drain electrode 46b respectively formed on the source and drain doped silicon layers 45. The thickness of the first and second sacrifice layers 49 varies with the thickness of the semiconductor layer 44 because the time for etching the first and second sacrifice layers 49 is substantially equal to the time for etching the semiconductor layer 44 in the subsequent process.

Finally, while the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method for forming a thin film transistor liquid crystal display (TFT-LCD), the TFT-LCD having at least one thin film transistor (TFT) and one storage capacitor (Cs), the method comprising the steps of:
   providing a substrate;
   depositing a first conductive layer and a second conductive layer above the substrate to form a gate electrode of the TFT and a bottom electrode of the storage capacitor;
   forming an insulating layer on the first and second conductive layers and the substrate;
   depositing a semiconductor layer and a doped silicon layer on the insulating layer;
   forming a sacrifice layer with an island shape on the doped silicon layer, and the sacrifice layer being positioned directly above the first conductive layer;
   forming a metal layer covering the sacrifice layer and the doped silicon layer;
   patterning the metal layer to form a source electrode and a drain electrode above the first conductive layer as well as to form a shielding metal layer above the second conductive layer, a channel being defined between the source electrode and the drain electrode to expose the sacrifice layer in the channel, a capacitor region being defined as a portion of the substrate covered by the shielding metal layer, and a non-TFT region being defined as a portion of the substrate not covered by the source electrode, the drain electrode, the capacitor region, and the channel so as to expose the doped silicon layer thereon;
   using the source electrode, the drain electrode, and the shielding metal layer as a mask to perform the following etching processes at the same time: (a) removing the doped silicon layer and the island-shaped sacrifice layer in the channel so as to expose the semiconductor layer therein, and (b) removing the doped silicon layer and the semiconductor layer in the non-TFT region so as to expose the insulating layer thereon; and
   forming a passivation layer to cover the source electrode, the drain electrode, the channel, and the capacitor region.

2. The method of claim 1, wherein during the etching process, etching rates of the island-shaped sacrifice layer, the doped silicon layer, and the semiconductor layer are RIS, Rn, and Ra respectively, the thickness of the island-shaped sacrifice layer, the doped silicon layer, and the semiconductor layer are TIS, Tn, and Ta, and the time for removing the island-shaped sacrifice layer and the doped silicon layer in the channel (TIS/RIS+Tn/Rn) is not less than the time for removing the doped silicon layer and the semiconductor layer in the non-TFT region (Tn/Rn+Ta/Ra).

3. The method of claim 1 further comprising the following steps:
   patterning the passivation layer to form a first hole and a second hole so as to expose one of the source electrode and the drain electrode through the first hole, and expose the shielding metal layer in the capacitor region through the second hole; and
   forming a transparent conductive layer being electrically connected to one of the source and the drain electrodes through the first hole, as well as electrically connected to the shielding metal layer through the second hole for forming an upper electrode of the storage capacitor.

4. A method for manufacturing a thin film transistor liquid crystal display (TFT-LCD), the TFT-LCD having at least one thin film transistor (TFT) and one storage capacitor, the method comprising the steps of:
   providing a substrate;
   depositing first and second conductive layers above the substrate to respectively form a gate electrode of the TFT and a bottom electrode of the storage capacitor;
   forming an insulating layer above the first and second conductive layers and the substrate;
   forming a semiconductor layer on the insulating layer;
   forming a sacrifice layer with an island shape on the semiconductor layer, and the sacrifice layer being positioned directly above the first conductive layer;
   depositing a doped silicon layer to cover the sacrifice layer and the semiconductor layer;
   forming a metal layer covering the doped silicon layer;
   patterning the metal layer to form a source electrode and a drain electrode above the first conductive layer, as well as to form a shielding metal layer above the second conductive layer; a channel being defined between the source electrode and the drain electrode to expose the doped silicon layer therein; a capacitor region being defined as a portion of the substrate covered by the shielding metal layer; and a non-TFT region being defined as the substrate not covered by the source electrode, the drain electrode, the capacitor, and the channel so as to expose the doped silicon layer thereon;
   using the source and drain electrodes and the shielding metal layer as a mask to perform these etching processes at the same time: (a) removing the doped silicon layer and the island-shaped sacrifice layer in the channel so as to expose the semiconductor layer in the channel, and (b) removing the doped silicon and semiconductor layers in the non-TFT region to expose the insulating layer therein;
   and forming a passivation layer to cover the source electrode, the drain electrode, the channel, and the capacitor region.

5. The method of claim 4, wherein during the etching process, etching rates of the island-shaped sacrifice layer, the doped silicon layer, and the semiconductor layer are RIS, Rn, and Ra respectively; the thickness of the island-shaped sacrifice layer, the doped silicon layer, and the semiconductor layer are TIS, Tn, and Ta; and the time for removing the doped silicon layer and the island-shaped sacrifice layer in the channel (TIS/RIS+Tn/Rn) is not less than the time for removing the doped silicon layer and the semiconductor layer in the non-TFT region (Tn/Rn+Ta/Ra).

6. The method of claim 5 further comprising the following steps:

forming a first hole and a second hole in the passivation layer so as to expose one of the source and drain electrodes via the first hole, and expose the shielding metal layer via the second hole; and forming a transparent conductive layer above the passivation layer, the transparent conductive layer being electrically connected to one of the source electrode and the drain electrode through the first hole, as well as electrically connected to the shielding metal through the second hole for forming an upper electrode of the storage capacitor.

* * * * *